United States Patent [19]

Chung

[11] Patent Number: 5,166,938
[45] Date of Patent: Nov. 24, 1992

[54] ERROR CORRECTION CIRCUIT USING A DESIGN BASED ON A NEURAL NETWORK MODEL COMPRISING AN ENCODER PORTION AND A DECODER PORTION

[75] Inventor: Ho-Sun Chung, Taegu, Rep. of Korea

[73] Assignee: Samsung Electronics Co., Ltd., Kyunggi, Rep. of Korea

[21] Appl. No.: 549,931

[22] Filed: Jul. 9, 1990

[30] Foreign Application Priority Data

Jun. 27, 1990 [KR] Rep. of Korea .................. 90-9552

[51] Int. Cl.⁵ ............................................. G06F 11/08
[52] U.S. Cl. ..................................... 371/37.1; 395/27
[58] Field of Search ....................... 395/27, 24, 22; 371/37.1

[56] References Cited

U.S. PATENT DOCUMENTS

| | | | |
|---|---|---|---|
| 4,988,891 | 1/1991 | Mashiko . | |
| 5,034,918 | 7/1991 | Jeong | 395/24 |
| 5,047,655 | 9/1991 | Chambost et al. | 307/201 |
| 5,058,049 | 10/1991 | Anderson | 395/24 |

OTHER PUBLICATIONS

Takefuji et al., Error Correcting System Based on Neural Circuits, IEEE catalog #87THO191-7, Jun. 1987.
Kwon et al., Implementation of a Programmable Artificial Neuron Using Discrete Logic, 1989 (no month available).
Eberhardt et al., Design of Parallel Hardware Neural Network Systems from Custom Analog VLSI 'Building Block' Chips, Jun. 1989.
Bloomer et al., A Preprogrammed Artificial Neural Network in Signal Processing, Proceedings of IEEE Custom IC May 1990.
Graf et al., VLSI Implementation of a Neural Network Model, 1988 (no month available).

Primary Examiner—Robert W. Beausoliel
Assistant Examiner—Henry C. Lebowitz
Attorney, Agent, or Firm—Cushman, Darby & Cushman

[57] ABSTRACT

An error correction circuit is provided which uses NMOS and PMOS synapses to form network type responses to a coded multi-bit input. Use of MOS technology logic in error correction circuits allows such devices to be easily interfaced with other like technology circuits without the need to use distinct interface logic as with conventional error correction circuitry.

4 Claims, 6 Drawing Sheets

FIG. 3B5 out 1 ............... out 14

ERROR CORRECTION CIRCUIT USING A DESIGN BASED ON A NEURAL NETWORK MODEL COMPRISING AN ENCODER PORTION AND A DECODER PORTION

BACKGROUND OF THE INVENTION

1. Field of the Invention

This invention relates to an error correction circuit and more particularly to an error correction circuit which is based on a neural network model.

2. Background of the Invention

A data processing system made of conventional logic circuits is getting bigger in size and more complex in its arrangement of components. As a result, increasing circuit complexity creates unexpected problems and rising manufacturing costs.

In addition, the need to improve accuracy and reliability of every block in the system or its respective subsystems, demands that techniques for providing error correction be included. However, systems based on simple logic circuits have performance limitations due to inherent property characteristics of logic gates.

To overcome such limitations of logic circuit technologies a system design based on the concept of a neural network model has been actively studied.

Figure 1:
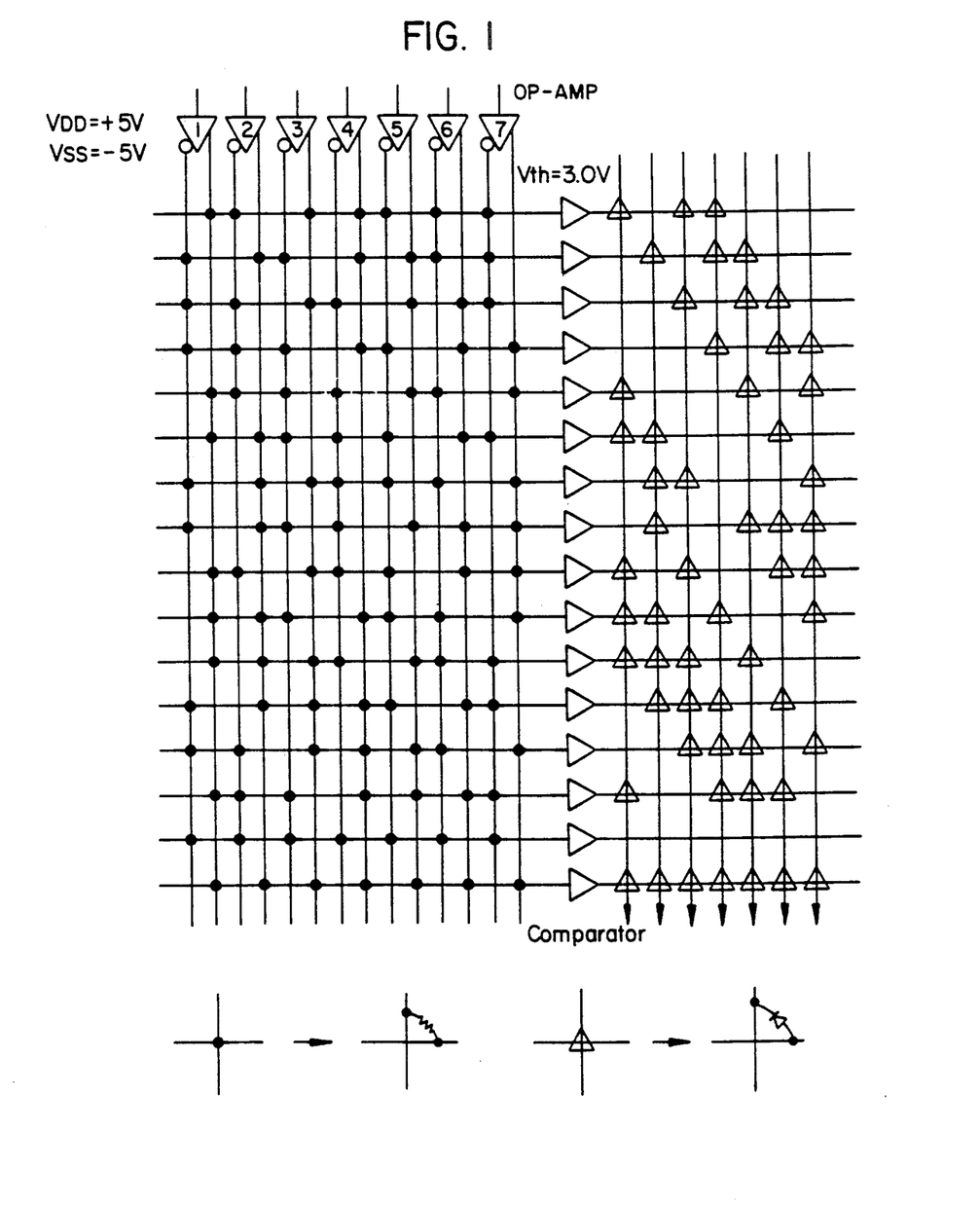
FIG. 1 is a circuit diagram showing a conventional error correction circuit having a design based on neutral network principles.

An error correcting system based on neural network principles is shown in FIG. 1. This system was presented in the IEEE first annual international conference on neural networks in Jun. 1987, which has a reference number of IEEE catalog #87TH0191-7, by Yoshiyasu Takefuji, Paul Hollis, Yoon Pin Foo, and Yong B. Cho.

The error correcting system presented at the above conference uses the concept of neural network principles, based on the Hopfield model, discloses a circuit which performs significantly faster than prior error correcting systems.

However, since the circuit by Yoshiyasu Takefuji et al. uses operational amplifiers as neurons and a passive resistor element network to form synapses, VLSI implementation is quite limited. The reason being that on a semiconductor integrated circuit, a resistor element network has high power consumption and thus hinders manufacturing of a high integration circuit design.

Furthermore, the above circuit is further inadequate since it requires additional interfacing circuitry added whenever a digital system based on NMOS and CMOS technologies is coupled thereto.

SUMMARY OF THE INVENTION

Accordingly, it is an object to provide an error correction circuit having a design which is based on neural network principles and which uses MOS transistors formed on semiconductor VLSI logic.

It is another object to provide an error correction circuit which is directly connectable to conventional NMOS and CMOS digital system technology without requiring additional interface logic.

In achieving the above objects, the present invention is characterized in that the circuit comprises:
n input neurons;
$2^k$ output neurons;
a plurality of first synapses;
a plurality of second synapses;
a plurality of first biasing synapses;
n inverters;
a plurality of third synapses; and
a plurality of second biasing synapses.

The neurons are buffer amplifiers in which two CMOS inverters are connected in cascade. A synapse for transferring an excitatory state includes a PMOS transistor, and a synapse for transferring an inhibitory state includes an NMOS transistor.

The connecting strength of synapses is determined by the geometrical aspect ratio W/L of each respective transistor and corresponds to the ratio of a transistor's channel width to its channel length.

In the present invention, the error correction circuit is made using CMOS technology and thus designed to be directly interfaceable to other CMOS and related technologies without the use of additional interface logic.

BRIEF DESCRIPTION OF THE DRAWINGS

The above objects and other advantages of the present invention will become more apparent by describing the preferred embodiment of the present invention with reference to the attached drawings, in which:

FIG. 2A-2F is a circuit diagram of a preferred embodiment showing a 1 bit error correction circuit of (7,4) codewords according to the present invention;

FIG. 3A1-3A7 and FIG. 3B1-3B5 combined, illustrate a circuit diagram of another embodiment of the present invention which provides 2 bit error correction of (14,6) codewords.

DESCRIPTION OF THE PREFERRED EMBODIMENTS

In error correcting circuits, an (n,k) code word represents k actual data bits and n-k check bits. That is, the codeword is n bits long and contains k actual data bits. Generally, an (n,k) code can generate all $2^k$ codes by using the following polynomial generating equation The equation is $$C(X) = D(X) * G(X)$$

where, C(X) is a codeword polynomial of the degree lower than n−1,

D(X) is a data polynomial of the degree lower than n−k, and

G(X) is a generating polynomial of the (n−k) the degree.

Thus, encoding the data polynomial D(X) means getting the codeword polynomial C(X) from D(X) multiplied by G(X).

Embodiment I

In a 1 bit error correction circuit of (7,4) codewords, when the generating polynomial of $G(X) = X^3 + X + 1$ is given to code a 4 bit data string as a (7,4) codeword, the following (7,4) codewords shown in Table 1 are obtained.

TABLE 1

| X3 | X2 | X1 | X0 | DOO | GOO | X6 | X5 | X4 | X3 | X2 | X1 | X0 |
|---|---|---|---|---|---|---|---|---|---|---|---|---|
| 0 | 0 | 0 | 0 |  |  | 0 | 0 | 0 | 0 | 0 | 0 | 0 |
| 0 | 0 | 0 | 1 | 1 |  | 0 | 0 | 0 | 1 | 0 | 1 | 1 |
| 0 | 0 | 1 | 0 | X |  | 0 | 0 | 1 | 0 | 1 | 1 | 0 |
| 0 | 0 | 1 | 1 | X + 1 |  | 0 | 0 | 1 | 1 | 1 | 0 | 1 |
| 0 | 1 | 0 | 0 | $X^2$ |  | 0 | 1 | 0 | 0 | 1 | 1 | 1 |
| 0 | 1 | 0 | 1 | $X^2 + 1$ |  | 0 | 1 | 0 | 1 | 1 | 0 | 0 |
| 0 | 1 | 1 | 0 | $X^2 + X$ | $X^3+X+1$ | 0 | 1 | 1 | 0 | 0 | 0 | 1 |
| 0 | 1 | 1 | 1 | $X^2 + X + 1$ |  | 0 | 1 | 1 | 1 | 0 | 1 | 0 |
| 1 | 0 | 0 | 0 | $X^3$ |  | 1 | 0 | 0 | 0 | 1 | 0 | 1 |
| 1 | 0 | 0 | 1 | $X^3 + 1$ |  | 1 | 0 | 0 | 1 | 1 | 1 | 0 |
| 1 | 0 | 1 | 0 | $X^3 + X$ |  | 1 | 0 | 1 | 0 | 0 | 1 | 1 |
| 1 | 0 | 1 | 1 | $X^3 + X + 1$ |  | 1 | 0 | 1 | 1 | 0 | 0 | 0 |
| 1 | 1 | 0 | 0 | $X^3 + X^2$ |  | 1 | 1 | 0 | 0 | 0 | 1 | 0 |
| 1 | 1 | 0 | 1 | $X^3 + X^2 + 1$ |  | 1 | 1 | 0 | 1 | 0 | 0 | 1 |
| 1 | 1 | 1 | 0 | $X^3 + X^2 + X$ |  | 1 | 1 | 1 | 0 | 1 | 0 | 0 |
| 1 | 1 | 1 | 1 | $X^3 + X^2 + X + 1$ |  | 1 | 1 | 1 | 1 | 1 | 1 | 1 |

As shown in Table 1, when only 1 bit errors can occur, the number of possible errors for each coded 4 bit data string equals 7. For example, code pattern "1011000" is explained in detail in Table 2.

TABLE 2

The error states of code pattern "1011000"

| 0011000 |
| 1111000 |
| 1001000 |
| 1010000 |
| 1011100 |
| 1011010 |
| 1011001 |

As shown in Table 2, each 1 bit error state of "1011000" does not match any of the other codewords. In connection with the smallest Hamming distance, the number of check bits is calculated by using the following equation:

$$Df \geq 2t + 1$$

where
t is the number of corrected bits, and
Df is the number of check bits.

Figures 2, 2A, 2B, 2C, 2D, 2E, 2F:
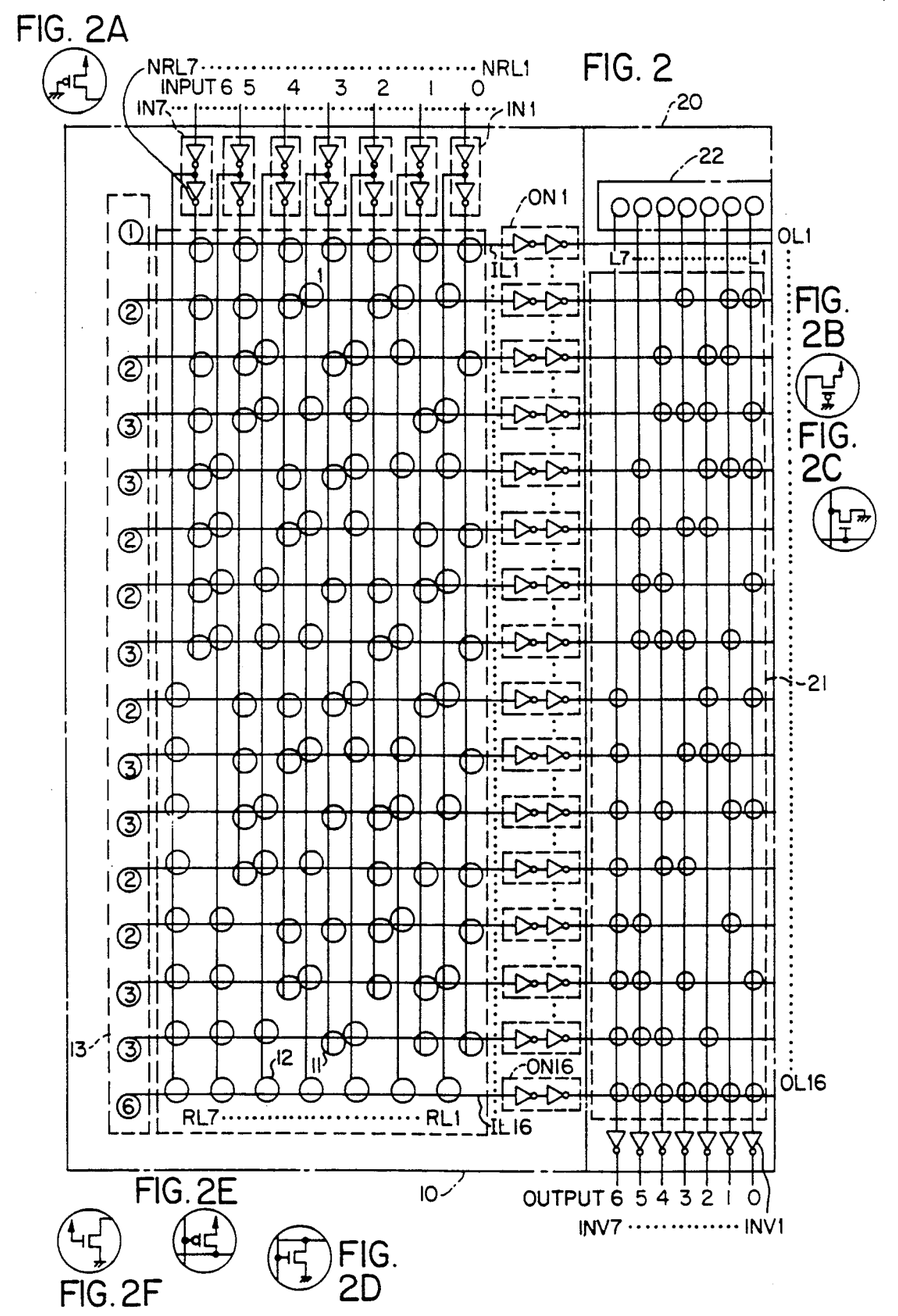

In FIG. 2, a 1 bit error correction circuit is shown as a (7,4) codeword according to the present invention. The error correction circuit comprises a decoder section of the single layer perceptron model type and an encoder section for providing correction.

Decoder 10 includes input neurons IN1 to IN7. Each input neuron is made by interconnecting two CMOS inverters. The output lines of a first one of the CMOS inverters corresponding to inverted output lines RL1 to RL7. The output lines of the other inverter corresponding to non-inverted output lines NRL1 to NRL7. Decoder 10 has $2^4 = 16$ output neurons ON1 to ON16 made by interconnecting two CMOS inverters. These output means drive respective output lines IL1 to IL16 into one of an excitatory state or an inhibitory state in response to the difference between the excitatory strength and the inhibitory strength pressed on each such respective input line IL1 to IL16.

NMOS transistors (first synapses 11) are connected along each position corresponding to a "0" for all of 16 codewords shown in Table 1 and connected at corresponding intersections of the noninverted output lines of the input neurons and the input lines of the output neurons.

PMOS transistors (second synapses 12) are connected along each position corresponding to a "1" of the same 16 codewords and connected at corresponding intersections of the inverted output lines of the input neurons and the input lines of the output neurons.

Each NMOS transistor is turned on when its corresponding noninverted output line is in a "HIGH" state and serves to transfer an inhibitory state, such as Vss or a ground potential, of unit connecting strength to the input line to which its respective drain is connected.

Each PMOS transistor is turned off when its corresponding inverted output line is in a "LOW" state and serves to transfer an excitatory state, such as Vcc or a supplying voltage, e.g. 5 V, of unit connecting strength to the input line to which its respective drain is connected.

A unit connecting strength is defined as a transistor width-to-length ration W/L that ratio being 6/2 [$\mu$m/mm] for a PMOS transistor and 2/2 [$\mu$m/mm] for an NMOS transistor.

When the excitatory strength is almost equal to the inhibitory strength, the conductance of the PMOS transistor is designed such that its unit connecting strength is superior to the conductance of a single NMOS transistor. As a result, in a balanced situation where the unit connecting strengths of all PMOS transistors is equal to that of all NMOS transistors, the excitatory state will prevail.

In addition, first biasing synapse circuit 13, consisting of NMOS and PMOS bias transistors, is connected to respective input lines of the output neurons. First biasing synapse circuit 13 has transistor excitatory or inhibitory connecting strengths assigned according to the value subtracted the number of bits to be corrected from the number of the second synapses 12 along each corresponding bias line.

In an example of code pattern "0001011" which is to be 1 bit error corrected, a corresponding first biasing synapse transistor is coupled to 3 PMOS transistors. As a result, an NMOS first biasing transistor is provided with a connecting strength of $3 - 1 = 2$ to therefore transfer a bias inhibitory state.

This NMOS transistor is formed having a geometrical aspect ratio of $W/L = 2 \cdot (2/2)$ [$\mu$m/$\mu$m].

The first transistor in the first biasing synapse circuit 13 connected to first input line IL1 has no PMOS transistors coupled thereto. Thus, in a 1 bit error correction circuit, a PMOS first biasing transistor is provided in response to a connecting strength of $0 - 1 = -1$ which serves to transfer an excitatory state. First biasing synapse circuit 13 makes only the output line of the output neuron, which corresponding codeword has the most similar pattern to the synapse pattern connected to the input line, excitatory. That output neuron will have a value of "1" and the other 15 output lines will be in the inhibitory state and will have value "0".

An excitatory output at each respective output neuron will occur for any one of eight unique code pattern input into decoder 10.

As described above, when the correct codeword is decoded among 16 possible codewords in decoder 10, the codeword is corrected in encoder 20. The encoder 20 includes lines L1 to L7 which are crossed with output lines OL1 to OL16 respectively coupled to outputs of output neurons ON1 to ON16. Lines of L1 to L7 are connected to output terminals via respective inverters INV1 to INV7.

Encoder 20 includes NMOS transistors (third synapses 21) selectively positioned at corresponding values of "1" of the (7,4) codewords shown in Table 1 and coupled along respective intersections between output lines OL1 to OL16 and lines L1 to L7. The NMOS transistors are turned on in response to a "HIGH" state from an excited output line connected to the gates of the transistors. As such, an inhibitory state (i.e., Vss or ground potential) is transferred with unit connecting strength to the line to which respective drains of the NMOS transistors are connected. Second biasing synapse circuit 22 ncludes unit connecting strength PMOS transistors connected to lines L1 to L7, as shown in FIG. 2. More specifically, first biasing synapses 13 cause the input lines of output neurons ON1 to ON16 to be high or lo in accordance with the following rules:

1. If $(A - B) + C > D$,
   THEN TRANSFER INHIBITORY STATE
2. IF $(A - B) + C <= D$,
   THEN TRANSFER EXCITATORY STATE where:
A is the number of PMOS (second) synapses in the word which should be transferring an excitatory state,
B is the number of PMOS (second) synapses in the word which actually are transferring an excitatory state,
C is the number of NMOS (first) synapses in the word which actually are transferring an inhibitory state, and
D is the number of bits the code corrects.

The implementation of these rules is accomplished by connecting the biasing synapses with a connecting strength equal to:

(# of PMOS (second) synapses in a word) − (# of bits the code corrects).

Second biasing synapse circuit 22 transfers the exciting state, i.e. Vcc or supplying voltage, to the line to which the respective transistor drains are connected to drive the output terminals of excited input inverters to "0", i.e. the "LOW" state usually.

Generally, in encoder 20 the unit connecting strength of each NMOS transistor is set to 2/2 [μm/μm] and the unit connecting the strength of each PMOS transistor is set to 5/2 [μm/μm]. Therefore, when the excitatory connecting strength is equal to the inhibitory connecting strength, the inhibitory state is eminently activated.

The following Table 3 shows the results from the input data of the error correction circuit.

| input DATA output DATA | | | |
| --- | --- | --- | --- |
| 0000000 | 0001011 | 0010110 | 0011101 |
| 0000001 | 0001010 | 0010111 | 0011100 |
| 0000010 | 0001001 | 0010110 | 0011111 |
| 0000100 | 0001111 | 0010010 | 0011001 |
| 0001000 | 0000011 | 0011110 | 0010101 |
| 0010000 | 0011011 | 0000110 | 0001101 |
| 0100000 | 0101011 | 0110110 | 0111101 |
| 1000000 | 1001011 | 1010110 | 1011101 |
| 0000000 | 0001011 | 0010110 | 0011101 |
| 0100111 | 0101100 | 0110001 | 0111010 |
| 0100110 | 0101101 | 0110000 | 0111011 |
| 0100101 | 0101010 | 0110011 | 0111000 |
| 0100011 | 0101000 | 0110101 | 0111110 |
| 0101111 | 0100100 | 0111001 | 0110010 |
| 0110111 | 0111100 | 0100001 | 0101010 |
| 0000111 | 0001100 | 0010001 | 0011010 |
| 1100111 | 1101100 | 1110001 | 1111010 |
| 0100111 | 0101100 | 0110001 | 0111010 |
| 1000101 | 1001110 | 1010011 | 1011000 |
| 1000100 | 1001111 | 1010010 | 1011001 |
| 1000111 | 1001100 | 1010001 | 1011010 |
| 1000001 | 1001010 | 1010111 | 1011100 |
| 1001101 | 1000110 | 1011011 | 1010000 |
| 1010101 | 1011110 | 1000011 | 1001000 |
| 1100101 | 1101110 | 1110011 | 1111000 |
| 0000101 | 0001110 | 0010011 | 0011000 |
| 0000000 | 1001110 | 1010011 | 1011000 |
| 1100010 | 1101001 | 1110100 | 1111111 |
| 1100011 | 1101000 | 1110101 | 1111110 |
| 1100000 | 1101011 | 1110110 | 1111101 |
| 1100110 | 1101101 | 1110000 | 1111011 |
| 1101010 | 1100001 | 1111100 | 1110111 |
| 1110010 | 1111001 | 1100100 | 1101111 |
| 1000010 | 1001001 | 1010100 | 1011111 |
| 0100010 | 0101001 | 0110100 | 0111111 |
| 1100010 | 1101001 | 1110100 | 1111111 |

Embodiment II

A 2 Bit Error Correction Circuit Of (14,6) Code

When the generating polynomial equation of $G(X) = X^3 + X^7 + X^6 + X^4 + 1$ is applied, $2^6 = 64$ codewords shown in Table 4 can be obtained.

TABLE 4

| | | |
| --- | --- | --- |
| 1 | 000000 | 00000000 |
| 2 | 000001 | 00010111 |
| 3 | 000010 | 00101110 |
| 4 | 000011 | 00111001 |
| 5 | 000100 | 01011100 |
| 6 | 000101 | 01001011 |
| 7 | 000110 | 01110010 |
| 8 | 000111 | 01100101 |
| 9 | 001000 | 10111000 |
| 10 | 001001 | 10100111 |
| 11 | 001010 | 10010110 |
| 12 | 001011 | 10000001 |
| 13 | 001100 | 11100100 |
| 14 | 001101 | 11110011 |
| 15 | 001110 | 11001010 |
| 16 | 001111 | 11011101 |
| 17 | 010000 | 01110000 |
| 18 | 010001 | 01100111 |
| 19 | 010010 | 01011110 |
| 20 | 010011 | 01001001 |
| 21 | 010100 | 00101100 |
| 22 | 010101 | 00111011 |
| 23 | 010110 | 00000010 |
| 24 | 010111 | 00010101 |
| 25 | 011000 | 11001000 |
| 26 | 011001 | 11011111 |
| 27 | 011010 | 11100110 |

TABLE 4-continued

| | | |
|---|---|---|
| 28 | 011011 | 11110001 |
| 29 | 011100 | 10010100 |
| 30 | 011101 | 10000011 |
| 31 | 011110 | 10111010 |
| 32 | 011111 | 10101101 |
| 33 | 100000 | 01010010 |
| 34 | 100001 | 01000101 |
| 35 | 100010 | 01111100 |
| 36 | 100011 | 01101011 |
| 37 | 100100 | 00001110 |
| 38 | 100101 | 00011001 |
| 39 | 100110 | 00100000 |
| 40 | 100111 | 00110111 |
| 41 | 101000 | 11101010 |
| 42 | 101001 | 11111101 |
| 43 | 101010 | 11000100 |
| 44 | 101011 | 11010011 |
| 45 | 101100 | 10110110 |
| 46 | 101101 | 10100001 |
| 47 | 101110 | 10011000 |
| 48 | 101111 | 10001111 |
| 49 | 110000 | 00100010 |
| 50 | 110001 | 00110101 |
| 51 | 110010 | 00001100 |
| 52 | 110011 | 00011011 |
| 53 | 110100 | 01111110 |
| 54 | 110101 | 01101001 |
| 55 | 110110 | 01011000 |
| 56 | 110111 | 01000111 |
| 57 | 111000 | 10011010 |
| 58 | 111001 | 10001101 |
| 59 | 111010 | 10110100 |
| 60 | 111011 | 10100011 |
| 61 | 111100 | 11000110 |
| 62 | 111101 | 11010001 |
| 63 | 111110 | 11101000 |
| 64 | 111111 | 11111111 |

In view of the 64 codewords from Table 4, a 2 bit error corrected state should not be matched with the other codewords. The smallest Hamming distance is known as 5 bits from the above described codewords, 8 bit check codewords are needed. For instance, when errors in the second codeword "00001 00010111" are to be detected, the number of possible error states are 106. That is, there are those cases where the codeword is itself, adds 1 bit, is missing a 1 bit, adds 1 bit and is missing 1 bit, adds 2 bits, and is missing 2 bits. The respective 106 cases will be shown in the following Table 5 to Table 9 for codeword "000001 00010111".

TABLE 5

The error state of adding 1 bit to "000001 00010111"

| | |
|---|---|
| 100001 | 00010111 |
| 010001 | 00010111 |
| 001001 | 00010111 |
| 000101 | 00010111 |
| 000011 | 00010111 |
| 000001 | 10010111 |
| 000001 | 01010111 |
| 000001 | 00110111 |
| 000001 | 00011111 |

TABLE 6

The error state of missing 1 bit from "000001 00010111"

| | |
|---|---|
| 000000 | 00010111 |
| 000001 | 00000111 |
| 000001 | 00010011 |
| 000001 | 00010101 |
| 000001 | 00010110 |

TABLE 7

The case of adding 1 bit and missing 1 bit to "0000100010111"

| | | | | | |
|---|---|---|---|---|---|
| 100000 | 00010111 | 010000 | 00010111 | 001000 | 00010111 |
| 100001 | 00000111 | 010001 | 00000111 | 001001 | 00000111 |
| 100001 | 00010011 | 010001 | 00010011 | 001001 | 00010011 |
| 100001 | 00010101 | 010001 | 00010101 | 001001 | 00010101 |
| 100001 | 00010110 | 000001 | 00010110 | 001001 | 00010110 |
| 000100 | 00010111 | 000010 | 00010111 | 000000 | 10010111 |
| 000101 | 00000111 | 000011 | 00010011 | 000001 | 00010011 |
| 000101 | 00010011 | 000011 | 00010011 | 000001 | 00010011 |
| 000101 | 00010101 | 000011 | 00010101 | 000001 | 00010101 |
| 000101 | 00010110 | 000011 | 00010110 | 000001 | 00010110 |
| 000000 | 00010111 | 011001 | 00110111 | 000000 | 00011111 |
| 000001 | 01000111 | 000001 | 00100111 | 000001 | 00001111 |
| 000001 | 01010011 | 000001 | 00110011 | 000001 | 00011011 |
| 000001 | 01010101 | 000001 | 00110101 | 000001 | 00011101 |
| 000001 | 01010110 | 000001 | 00110110 | 000001 | 00011110 |

TABLE 8

The case of adding 2 bits to "000001 00010111"

| | | | | | |
|---|---|---|---|---|---|
| 110001 | 00010111 | 011001 | 00010111 | 001101 | 00010111 |
| 101001 | 00010111 | 011001 | 00010111 | 001001 | 00010111 |
| 100101 | 00010111 | 010011 | 00010111 | 001001 | 10010111 |
| 100011 | 00010111 | 010001 | 10010111 | 001001 | 01010111 |
| 100001 | 10010111 | 010001 | 01010111 | 001001 | 00101111 |
| 100001 | 01010111 | 010001 | 00110111 | 001001 | 00011111 |
| 100001 | 00110111 | 010001 | 00011111 | 100001 | 00011111 |
| 100001 | 00111111 | 010001 | 00011111 | 100001 | 00011111 |
| 000111 | 00010111 | 000011 | 10010111 | 000001 | 11010111 |
| 000101 | 10010111 | 000011 | 01010111 | 000001 | 10110111 |
| 000101 | 01010111 | 000011 | 00110111 | 000001 | 10011111 |
| 000101 | 00110111 | 000011 | 00011111 | 000101 | 00011111 |
| 000001 | 01110111 | 000001 | 00111111 | 000001 | 01011111 |

TABLE 9

The case of missing 2 bits from "000001 00010111"

| | | | | | |
|---|---|---|---|---|---|
| 000000 | 00000111 | 000001 | 00000011 | 000001 | 00010001 |
| 000000 | 00010011 | 000001 | 00000101 | 000001 | 00010010 |
| 000000 | 00010101 | 000001 | 00000110 | 000001 | 00010100 |
| 000000 | 00010110 | | | | |

As described above, when any one of the above 106 inputs is entered, only the output value of the second codeword position will be 1, and the other output values of the remaining 63 codeword positions will be 0.

Figures 3A, 3A, 3A, 3A, 3A, 3A, 3A:
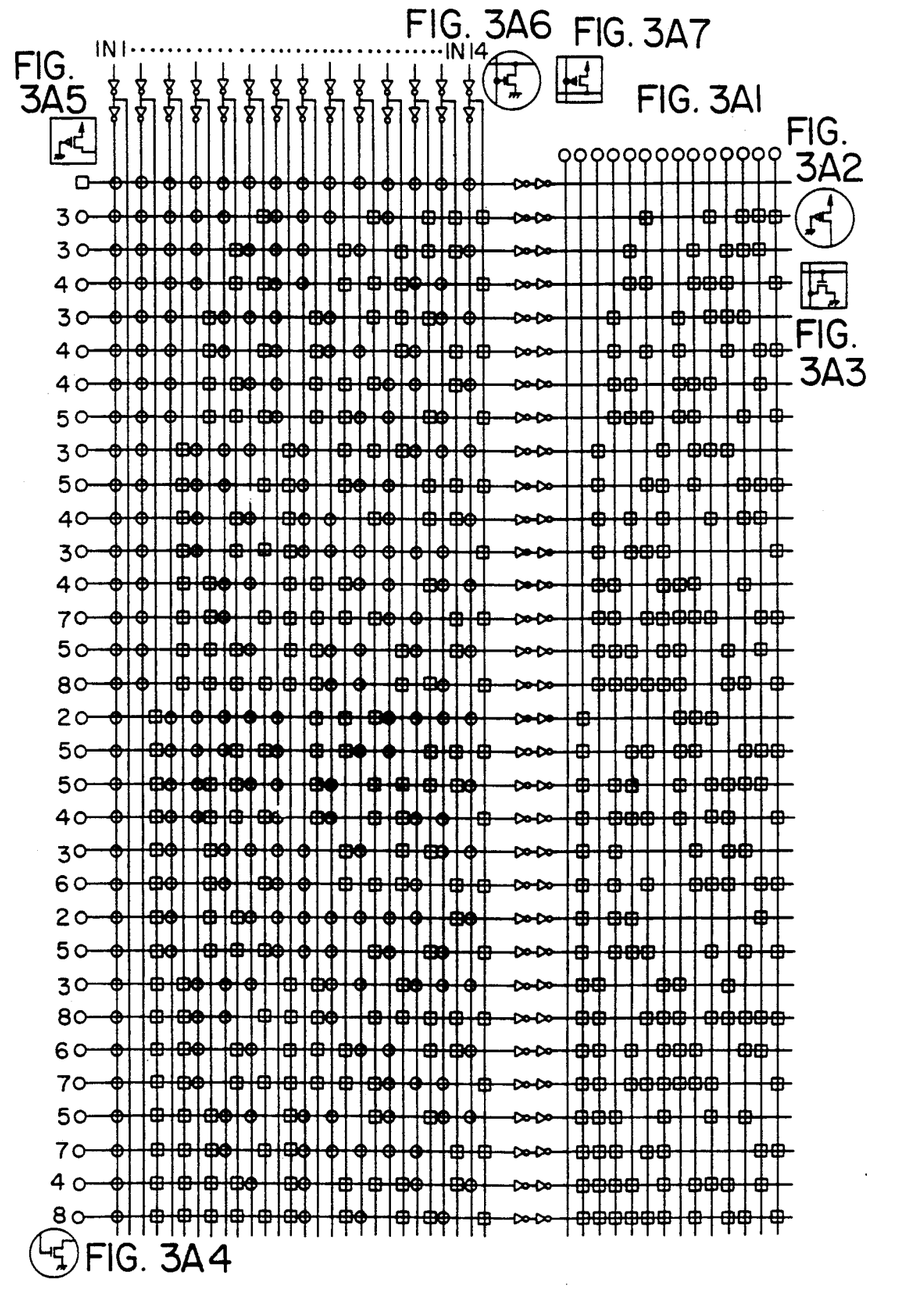
Figures 3B, 3B, 3B, 3B, 3B:
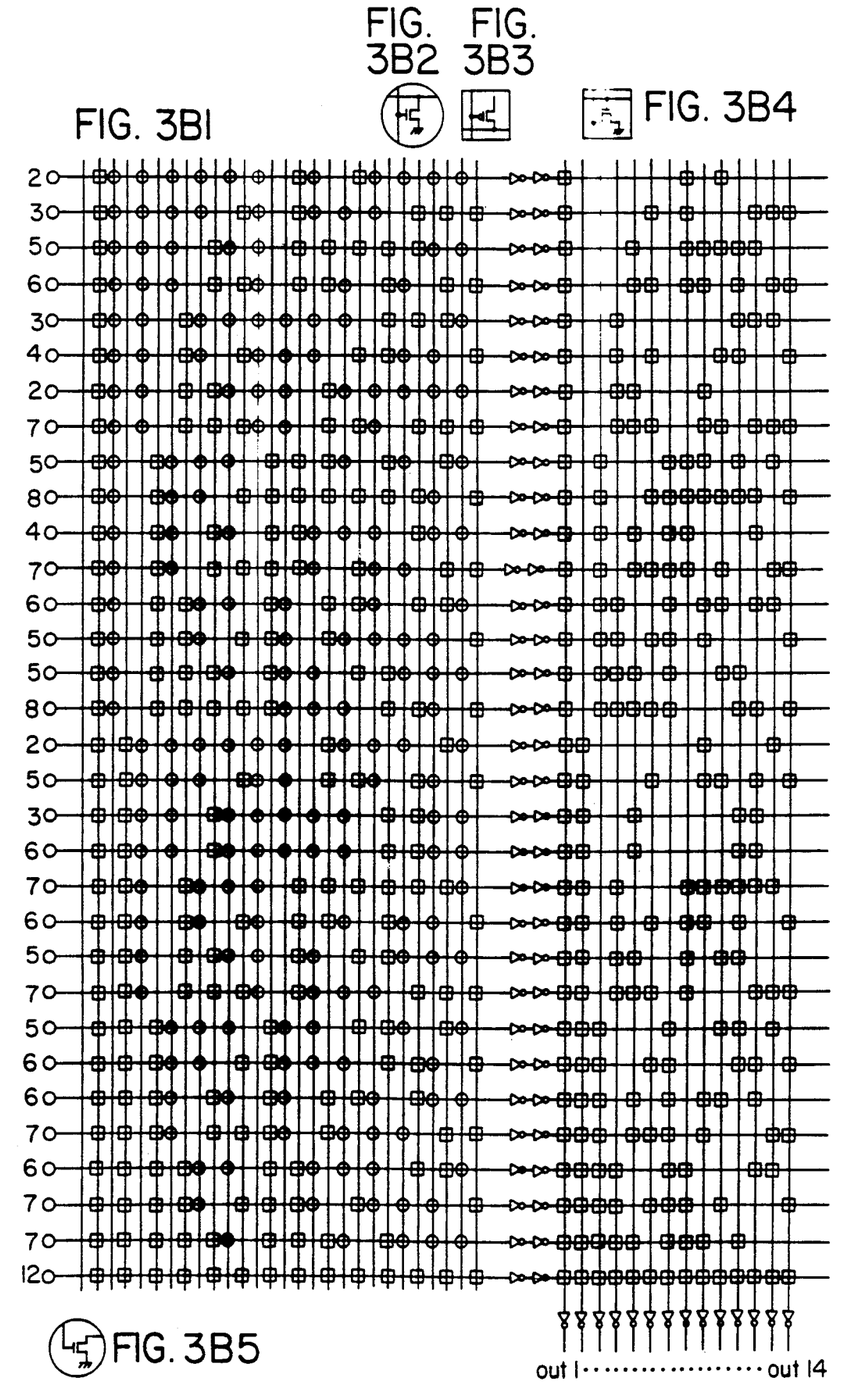

In FIG. 3A and FIG. 3B, the 2 bit error correction circuit of (14,6) code is expanded proportional to the length of the 1 bit error correction circuit of (7,4) shown in FIG. 2 so that it has the same concept and the detailed description will be omitted.

Figure 4:
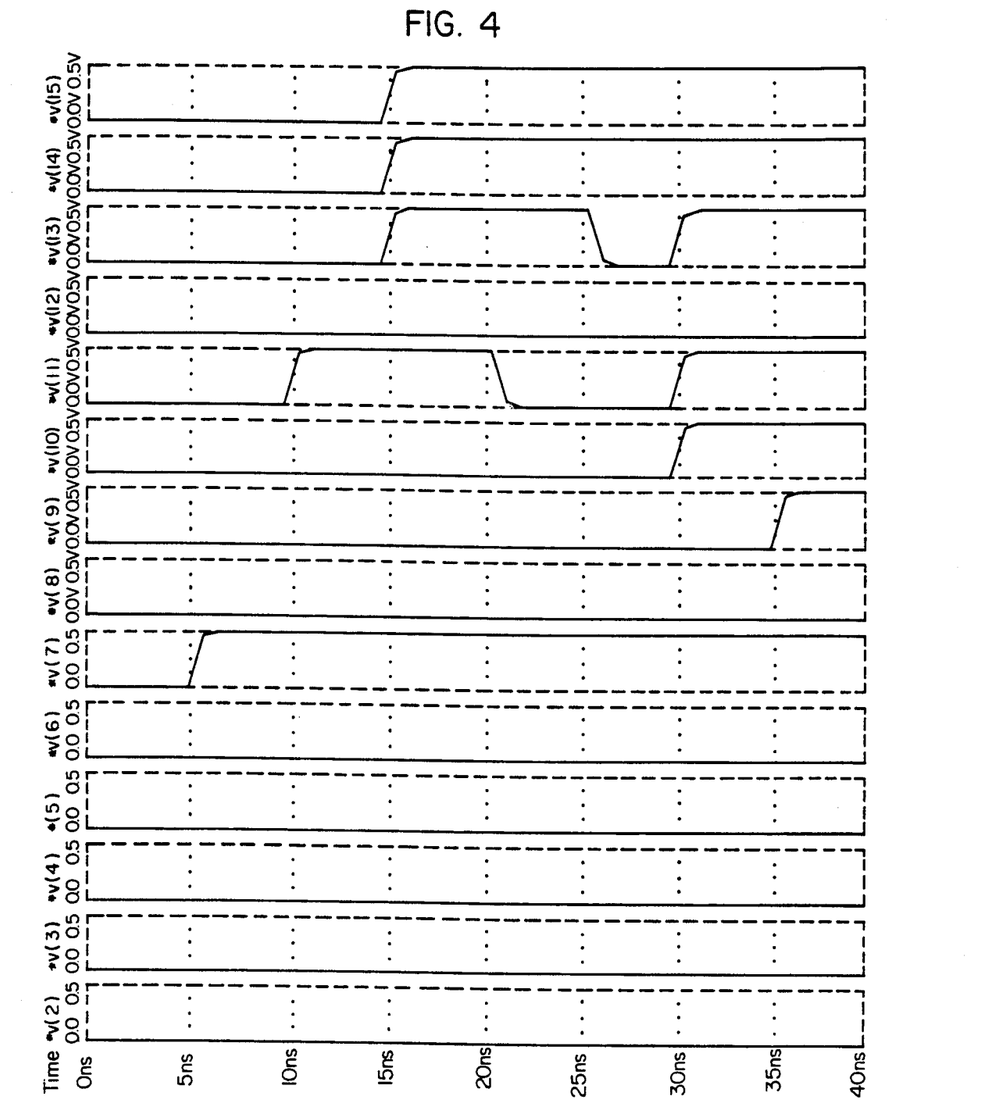
FIGS. 4 and 5 show input and output waveform signals, respectively, for the circuit in FIGS. 3A and 3B.

FIG. 4 illustrates the input waveforms of the error patterns of "00000100010111" and "000000 000000000". First the initial value of the input is shown set to 0; then there is input error states which add 1 bit and then add 2 bits; "00000100010111" pattern; missing 1 bit; missing 2 bits; adding 1 bit; and missing 1 bit at 5 msec intervals.

Figure 5:
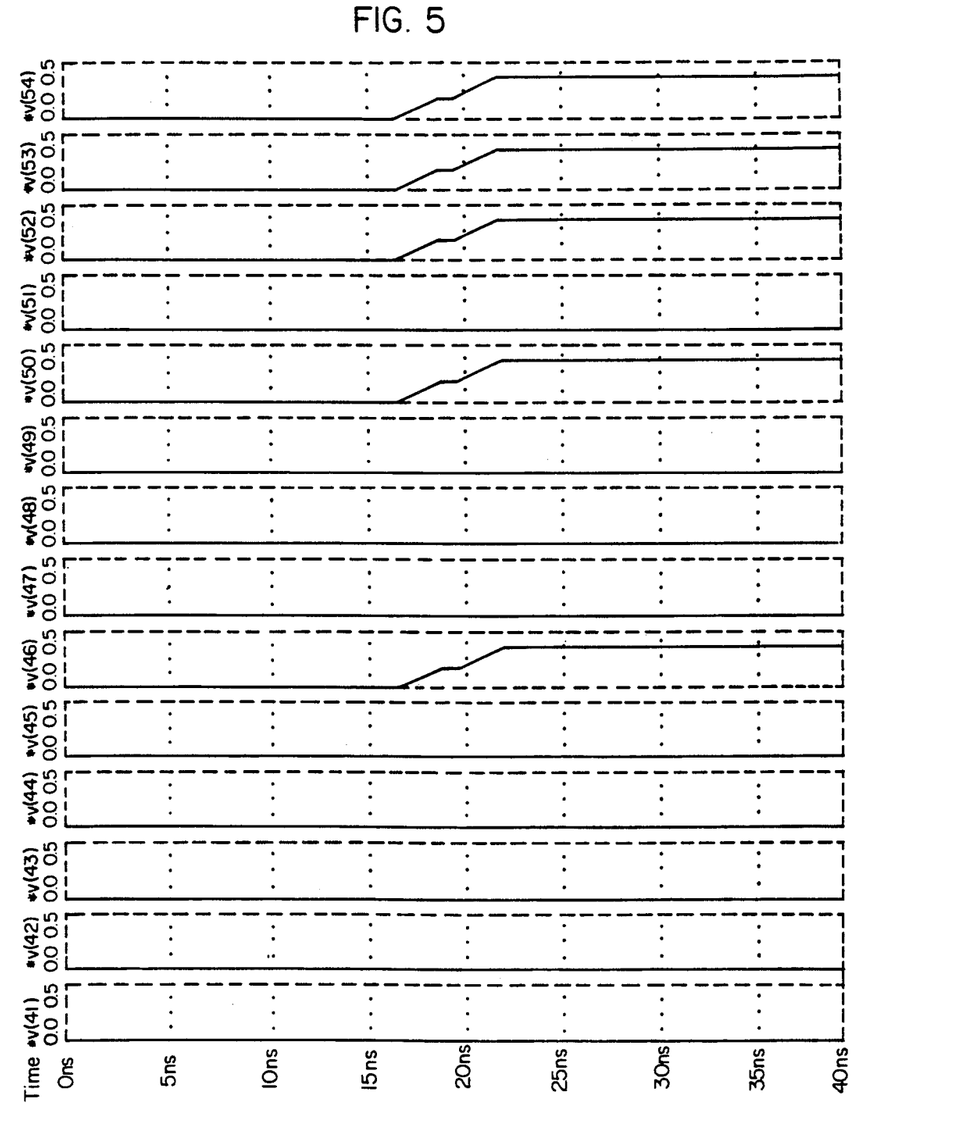

FIG. 5 illustrates the respective output waveforms corresponding to the above input waveforms in FIG. 4. When a possible error state to "000000 00000000" is entered, "000000 000000000" is outputted. When a possible error state of "00000100010111" is entered, "00000100010111" is outputted.

Therefore, the present invention achieves eminence by providing simplicity, capacity for parallel processing, faster processing velocity, and VLSI implementation.

What is claimed is:

1. An error correction circuit for error correcting a code with length n, $2^k$ codewords, and an error correction capability of c bits, said error correction circuit comprising;

n inputs neurons for receiving an n-bit coded signal and generating in response thereto n inverted signals and n non-inverted signal storage unit synapse means coupled to said n input neurons and comprising:

n inverted lines and n non-inverted lines each for respectively receiving a corresponding one of said n inverted signals and said n non-inverted signals;

$2^k$ first bias lines, each corresponding to one of said $2^k$ codewords;

a plurality of first bias synapse means, each coupled to a respective one of said $2^k$ first bias lines, for providing either inhibitory or excitation state to said first bias lines with a predetermined connecting strength;

a plurality of first synapse means coupled between each of said first bias lines and each of said non-inverted lines corresponding to the bits where there is a 0 in the codeword which corresponds to said each first bias line, for selectively providing inhibitory state with a first connecting strength to said each first bias line, depending on the value of said non-inverted signal on said each non-inverted line;

a plurality of second synapse means coupled between each of said first bias lines and each of said inverted lines corresponding to the bits where there is a 1 in the codeword which corresponds to said each bias line, for selectively providing excitatory state with a second connecting strength to said each first bias line, depending on the value of said inverted signal on said each inverted line; and $2^k$ output neurons, each of said output neurons coupled to receive a respective one of said $2^k$ first bias lines as an input signal and provide an output signal in response thereto, each of said $2^k$ output neurons corresponding to the codeword of its respective first bias line, wherein each of said plurality of first bias synapse means has either an excitatory or an inhibitory state and a predetermined connecting strength such that when said received n-bit signal differs from one of said codewords by less than or equal to the number of bits of the error correction capability c, the output neuron corresponding to said one codeword outputs a signal opposite of the signal output by the rest of said output neurons; and encoder means comprising:

$2^k$ coupling lines, each for respectively receiving a corresponding output signal from each of said $2^k$ output neurons, and wherein each coupling line is associated with the codeword corresponding to its each said respective one of said $2^k$ output neurons;

n second bias lines;

a plurality of second bias synapse means, each coupled to a respective one of said n second bias lines, for providing either inhibitory or excitatory state to said second bias lines with a predetermined connecting strength;

a plurality of third synapse means coupled between each of said second bias lines and each of said coupling lines corresponding to the bits where there is a 1 in the codeword which corresponds to said each coupling line;and n output inverters, each of said output inverters coupled to receive a respective one of said n second bias lines as an input signal, said output inverters providing an output signal which corresponds to an n-bit error corrected signal.

2. The error correction circuit of claim 1, wherein each of said first synapses is an NMOS transistor and each of said second synapse is a PMOS transistor.

3. The error correction circuit of claim 1, wherein each of said connecting strength is determined by the geometrical aspect ratio (W/L) of the particular transistor forming a synapse.

4. The error correction circuit of claim 1, wherein each of said n input neurons comprises two series connected CMOS inverters.

* * * * *